US010037277B2

(12) United States Patent
Feldman et al.

(10) Patent No.: US 10,037,277 B2
(45) Date of Patent: *Jul. 31, 2018

(54) MULTI-TIERED CACHING FOR DATA STORAGE MANAGEMENT IN A DEVICE

(71) Applicant: Seagate Technology LLC, Cupertino, CA (US)

(72) Inventors: Timothy R. Feldman, Louisville, CO (US); Andrew M. Kowles, Lyons, MN (US); Mark Allen Gaertner, Vadnais Heights, MN (US); Brian T. Edgar, Minneapolis, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/477,353

(22) Filed: Apr. 3, 2017

(65) Prior Publication Data
US 2017/0206161 A1 Jul. 20, 2017

Related U.S. Application Data

(63) Continuation of application No. 14/575,616, filed on Dec. 18, 2014, now Pat. No. 9,612,956, which is a (Continued)

(51) Int. Cl.
*G06F 12/08* (2016.01)
*G06F 12/06* (2006.01)
*G06F 12/0811* (2016.01)

(52) U.S. Cl.
CPC .......... *G06F 12/0811* (2013.01); *G06F 12/06* (2013.01); *G06F 2212/283* (2013.01)

(58) Field of Classification Search
CPC . G06F 12/0811; G06F 12/06; G06F 2212/283
See application file for complete search history.

(56) References Cited

U.S. PATENT DOCUMENTS

| 5,586,291 A | 12/1996 | Lasker et al. |
| 5,852,705 A | 12/1998 | Hanko et al. |

(Continued)

OTHER PUBLICATIONS

Write Caching, Charles M. Kozierok, Apr. 17, 2001, retrieved from http://www.pcguide.com/ref/hdd/op/cacheWrite-c.html on Jan. 11, 2014 (2 pages).

(Continued)

*Primary Examiner* — Larry T MacKall
(74) *Attorney, Agent, or Firm* — Westman, Champlin & Koehler, P.A.

(57) ABSTRACT

A data storage device includes one or more storage media that include multiple physical storage locations. The device also includes at least one cache memory having a logical space that includes a plurality of separately managed logical block address (LBA) ranges. Additionally, a controller is included in the device. The controller is configured to receive data extents addressed by a first LBA and a logical block count. The controller is also configured to identify at least one separately managed LBA range of the plurality of separately managed LBA ranges in the at least one cache memory based on LBAs associated with at least some of the received data extents. The controller stores the at least some of the received data extents in substantially monotonically increasing LBA order in at least one physical storage location, of the at least one cache memory, assigned to the identified at least one LBA range.

19 Claims, 7 Drawing Sheets

Related U.S. Application Data continuation-in-part of application No. 13/839,132, filed on Mar. 15, 2013, now Pat. No. 9,588,886.

(56) References Cited

U.S. PATENT DOCUMENTS

| | | | |
|---|---|---|---|
| 5,884,098 A | 3/1999 | Mason, Jr. | |
| 6,157,984 A | 12/2000 | Fisher et al. | |
| 6,295,577 B1 | 9/2001 | Anderson et al. | |
| 6,330,640 B1 | 12/2001 | Williams et al. | |
| 6,366,980 B1 | 4/2002 | Haines et al. | |
| 6,516,426 B1 | 2/2003 | Forehand et al. | |
| 6,757,781 B2 | 6/2004 | Williams et al. | |
| 6,826,630 B2 | 11/2004 | Olds et al. | |
| 6,907,499 B2 | 6/2005 | Herbst et al. | |
| 6,996,668 B2 | 2/2006 | Gaertner et al. | |
| 7,099,993 B2 | 8/2006 | Keeler | |
| 7,318,121 B2 | 1/2008 | Gaertner et al. | |
| 7,350,046 B2 | 3/2008 | Sicola et al. | |
| 7,406,547 B2 | 7/2008 | Haines et al. | |
| 7,966,450 B2 | 6/2011 | Klein | |
| 7,982,994 B1 | 7/2011 | Erden et al. | |
| 8,015,433 B2 | 9/2011 | Chu et al. | |
| 8,032,699 B2 | 10/2011 | Feldman et al. | |
| 8,171,219 B2 | 5/2012 | Trika et al. | |
| 8,195,909 B2 | 6/2012 | Haines et al. | |
| 8,296,504 B2 | 10/2012 | Chu et al. | |
| 8,327,076 B2 | 12/2012 | Murphy et al. | |
| 8,332,582 B2 | 12/2012 | Nakamura et al. | |
| 8,402,210 B2 | 3/2013 | Mannen et al. | |
| 8,412,884 B1 | 4/2013 | Ide et al. | |
| 8,417,839 B1 | 4/2013 | Ng et al. | |
| 8,443,165 B2 | 5/2013 | Haines et al. | |
| 8,468,370 B2 | 6/2013 | Miller et al. | |
| 8,519,673 B2 | 8/2013 | Williams | |
| 8,560,770 B2 | 10/2013 | Haines et al. | |
| 8,621,144 B2 | 12/2013 | Eschmann et al. | |
| 8,621,145 B1 | 12/2013 | Klimmel et al. | |
| 8,631,204 B2 | 1/2014 | Haines et al. | |
| 8,724,401 B2 | 5/2014 | Friendshuh et al. | |
| 8,745,421 B2 | 6/2014 | Miller et al. | |
| 8,819,375 B1 | 8/2014 | Pruett et al. | |
| 9,189,395 B2 * | 11/2015 | Na | G06F 12/08 |
| 2002/0029354 A1 | 3/2002 | Forehand et al. | |
| 2002/0108016 A1 | 8/2002 | Haines et al. | |
| 2003/0145165 A1 | 7/2003 | Herbst et al. | |
| 2003/0149815 A1 | 8/2003 | Williams et al. | |
| 2004/0174631 A1 | 9/2004 | Tanaka et al. | |
| 2005/0015567 A1 | 1/2005 | Zohar et al. | |
| 2005/0055517 A1 | 3/2005 | Olds et al. | |
| 2005/0066121 A1 | 3/2005 | Keeler | |
| 2005/0240792 A1 | 10/2005 | Sicola et al. | |
| 2006/0075202 A1 | 4/2006 | Gaertner et al. | |
| 2007/0150693 A1 | 6/2007 | Kaneko et al. | |
| 2008/0007219 A1 | 1/2008 | Williams | |
| 2008/0065845 A1 | 3/2008 | Montero et al. | |
| 2008/0313396 A1 | 12/2008 | Feldman et al. | |
| 2009/0198888 A1 | 8/2009 | Mannen et al. | |
| 2009/0199217 A1 | 8/2009 | McBrearty et al. | |
| 2009/0276588 A1 | 11/2009 | Murase | |
| 2010/0037009 A1 | 2/2010 | Yano et al. | |
| 2010/0293337 A1 | 11/2010 | Murphy et al. | |
| 2010/0332717 A1 | 12/2010 | Maeda et al. | |
| 2011/0075490 A1 | 3/2011 | Friendshuh et al. | |
| 2011/0082985 A1 | 4/2011 | Haines et al. | |
| 2011/0106804 A1 | 5/2011 | Keeler et al. | |
| 2011/0119442 A1 | 5/2011 | Haines et al. | |
| 2011/0161557 A1 | 6/2011 | Haines et al. | |
| 2012/0017045 A1 | 1/2012 | Haines et al. | |
| 2012/0069466 A1 | 3/2012 | Okamoto et al. | |
| 2012/0131265 A1 | 5/2012 | Koltsidas et al. | |
| 2012/0221826 A1 | 8/2012 | Haines et al. | |
| 2013/0038960 A1 | 2/2013 | Song | |
| 2013/0275780 A1 | 10/2013 | Miller et al. | |
| 2013/0318295 A1 | 11/2013 | Kojima | |
| 2014/0177085 A1 | 6/2014 | Haga et al. | |
| 2014/0181369 A1 | 6/2014 | Horn | |
| 2014/0189234 A1 | 7/2014 | Tang et al. | |
| 2014/0254042 A1 | 9/2014 | Yeo et al. | |
| 2014/0281183 A1 | 9/2014 | Edgar et al. | |
| 2014/0281229 A1 | 9/2014 | Kowles | |
| 2014/0285923 A1 | 9/2014 | Aoki | |

OTHER PUBLICATIONS

Momentus 5400 PSD, Seagate, copyright 2007, retrieved from http://www.seagate.com/docs/pdf/datasheet/disc/ds_momentus_5400_psd.pdf on Aug. 14, 2013 (2 pages).

22 File Caching, Spring 2000, retrieved from www.mpi-sws.org/~druschel/cources/os/lectures/fs-chaching.ps.gz? Jan. 11, 2014 (2 pages).

Product Manual Momentus 5400 FDE, Seagate, Aug. 2007, retrieved from http://www.seagate.com/staticfiles/support/disc/manuals/notebook/momentus/5400.2/PATA/100377037c.pdf on Jan. 11, 2014 (56 pages).

Computer Architecture: A Quantitative Approach (Third Edition), Hennessy et al., May 31, 2002, ISBN-10 1558605957, ISBN-13 978-1558605961, p. 683 (1 page).

Data Storage—Logical Block Addressing (LBA), Nico Gerard, Sep. 21, 2010, retrieved from http://gerardnico.com/wiki/data_storage/lba on Jan. 11, 2014 (2 pages).

What is disk cache, Webopedia, retrieved from http://www.webopedia.com/TERM/D/disk_cache.html on Jan. 11, 2014 (3 pages).

USPTO-issued prosecution for U.S. Appl. No. 14/575,616, filed Dec. 18, 2014, including: Notice of Allowance dated Nov. 18, 2016, 7 pages; Final Rejection dated Sep. 8, 2016, 15 pages; and Non-Final Rejection dated Feb. 24, 2016, 17 pages; 39 total pages.

* cited by examiner

MULTI-TIERED CACHING FOR DATA STORAGE MANAGEMENT IN A DEVICE

CROSS-REFERENCE TO RELATED APPLICATION

The present application is a continuation application of U.S. patent application Ser. No. 14/575,616, filed on Dec. 18, 2014, which is a continuation-in-part of and claims priority of U.S. patent application Ser. No. 13/839,132, filed Mar. 15, 2013, the contents of U.S. patent application Ser. Nos. 14/575,616 and 13/839,132 are hereby incorporated by reference in their entirety.

BACKGROUND

Data storage devices are used to access digital data in a fast and efficient manner. At a user level, data are often structured in terms of variable length files, which can be constituted from one or more fixed-sized logical blocks (such as logical blocks which are addressed using logical block addresses (LBAs)).

To store or retrieve user data with an associated data storage device, host commands are generally issued to the device using a logical block convention. The device links LBAs associated with host write commands to physical locations or blocks of media on which the data are to be stored. The device may also utilize logical to physical translation methods to locate logical blocks in an optimal physical location from which the data are to be retrieved.

When the data storage device is characterized as a disc drive, a controller may be used to execute a seek command to move a data transducer adjacent a rotating recording disc and carry out the data transfer operation with the associated physical block(s). Other types of data storage devices (for example, solid state data storage devices that have no moving parts) generally carry out other types of access operations to transfer the associated data.

With continued demands for data storage devices with ever higher data storage and data transfer capabilities, there remains a continual need for improvements in a manner in which storage of data associated with logical blocks is managed within the data storage device. It is to these and other improvements that the present embodiments are generally directed.

SUMMARY

In a particular embodiment, a data storage device includes one or more storage media that comprise a plurality of physical storage locations. The device also includes at least one cache memory having a logical space that includes a plurality of separately managed logical block address (LBA) ranges. Additionally, a controller is included in the device. The controller is configured to receive data extents addressed by a first LBA and a logical block count. The controller is also configured to identify at least one separately managed LBA range of the plurality of separately managed LBA ranges in the at least one cache memory based on LBAs associated with at least some of the received data extents. The controller stores the at least some of the received data extents in substantially monotonically increasing LBA order in at least one physical storage location, of the at least one cache memory, assigned to the identified at least one LBA range.

In another particular embodiment, a method is disclosed that includes transferring first data extents from a first memory area to a second memory area based on logical block addresses (LBAs) associated with the first data extents being within an LBA range of a plurality of separately managed LBA ranges. The first data extents are stored in substantially monotonically increasing LBA order in at least one physical storage location, of the second memory area, assigned to the LBA range of the plurality of LBA ranges.

In yet another particular embodiment, a method is disclosed that includes providing, in a data storage device, one or more storage media that include a plurality of physical storage locations. The method also includes providing a plurality of cache memory levels in the data storage device. The plurality of provided cache memory levels includes a first level cache memory and a second level cache memory. The second level cache memory has a logical space that includes a plurality of separately managed logical block address (LB A) ranges. Data extents addressed by a first LBA and a logical block count are stored into the first level cache memory substantially in an order in which the data extents are received in the data storage device. The method further includes gathering at least some of the data extents stored in the first level cache memory, and identifying at least one LBA range of the plurality of LBA ranges in the second level cache memory based on LBAs associated with the gathered data extents. The gathered data extents are stored in substantially monotonically increasing LBA order in at least one physical storage location, of the second level cache memory, assigned to the identified at least one LBA range.

DETAILED DESCRIPTION OF ILLUSTRATIVE EMBODIMENTS

The disclosure is related to multi-level write caching for data storage management in data storage or memory devices.

Figure 1A:
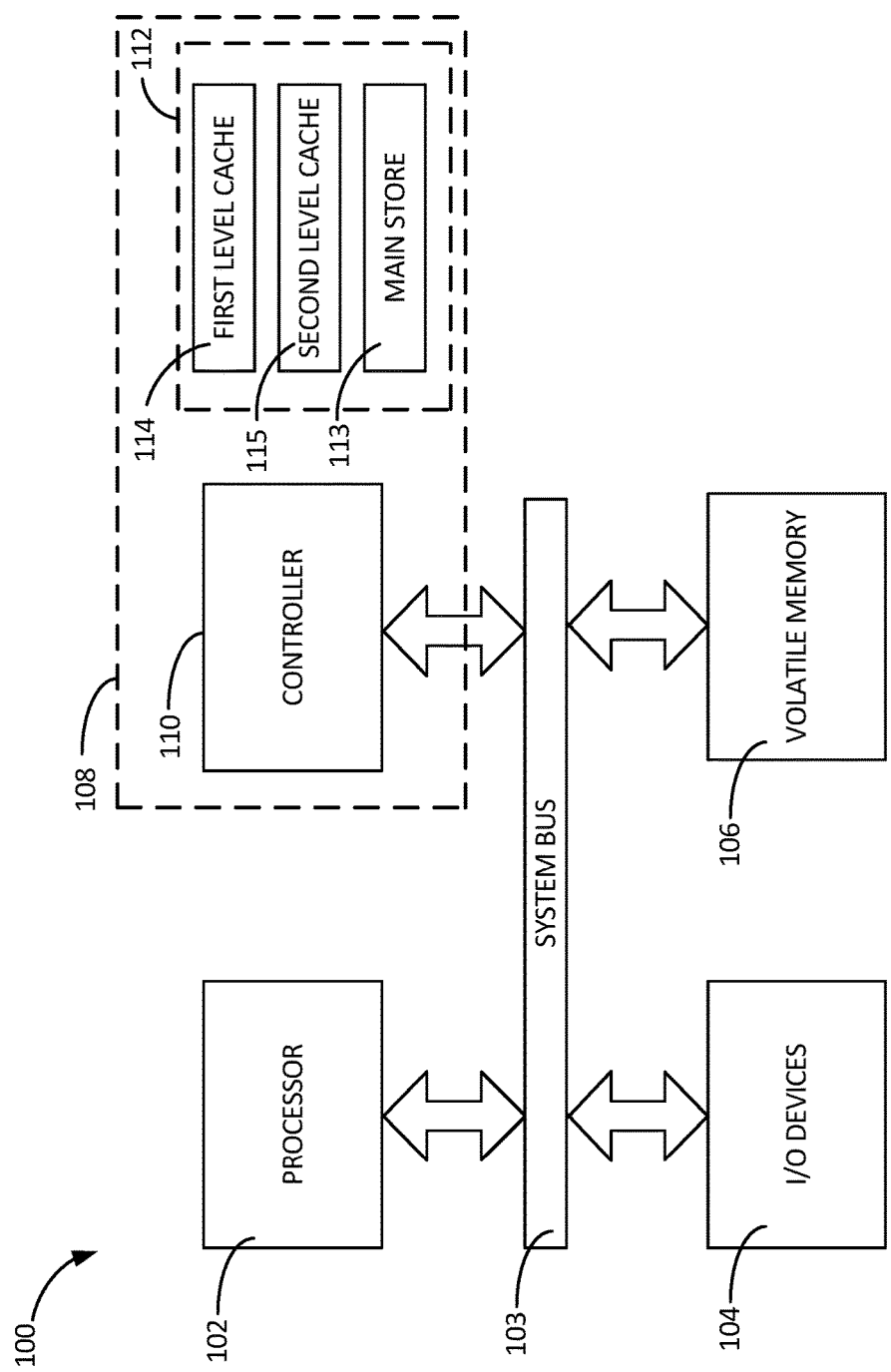
FIG. 1A is a simplified block diagram of an illustrative embodiment of a system of data storage management.

Referring to FIG. 1A, a particular embodiment of a system of data storage management is shown and generally designated 100. The system of data storage management 100 may include a processor 102 connected to a system bus 103 which also can be connected to input/output (I/O) devices 104, such as a keyboard, monitor, modem, storage device, or pointing device. The system bus 103 may also be coupled to a memory 106, which may be a random access volatile memory. The system bus may additionally be coupled to a memory device 108.

The memory device 108 may include a controller 110, which may be coupled to the processor 102 via a connection through the system bus 103. In one embodiment, the memory device 108 comprises at least one storage entity 112. In a particular embodiment, storage entity 112 includes a plurality of memories of various sizes and types. In some embodiments, device 108 employs a multi-level cache that allows for sequential appends of data in the caches, and pre-grouped and pre-sorted logical block addresses (LBAs) in an upper level cache when promoting to main store and its one-extent-per-band mapping. The storage entity 112 is organized as a non-overlapping set of storage areas referred to herein as physical bands as further described in FIGS. 4 and 5, below. In one embodiment, the physical bands are all of the same data capacity. As shown in FIG. 1A, storage entity 112 is further organized for three uses, namely a first level cache 114, a second level cache 115 and main store 113. In one embodiment, each physical band may be allocated to one of these uses. Physical bands that are not allocated to one of these uses are organized in a free pool. In one embodiment, physical storage locations for first level cache 114, second level cache 115 and main store 113 may be allocated from a free pool of physical bands available in storage entity 112. The main store 113 is organized as a non-overlapping set of logical ranges referred to herein as logical bands. In one embodiment, the logical bands are all of the same data capacity, and are of the same size as the physical bands. In general, each of the first level cache 114, the second level cache 115 and the main store 113 can be allocated from a pool of homogeneous or heterogeneous memory.

During operation, the processor 102 may send commands and data to the memory device 108 to retrieve or store data. The controller 110 can receive the commands and data from the processor 102 and then manage the execution of the commands to store or retrieve data from storage entity 112. It should be noted that controller 110 may include one or more integrated circuits.

In some embodiments, write commands received in memory device 108 from processor 102 or any other suitable sending interface include data addressed by LBAs. Device 108 processes the received commands and ultimately stores the data accompanying the received commands into storage entity 112. Locations within main store 113 may be mapped to individual LBAs and/or LBA extents. In some embodiments, individual ones of the LBAs or LBA extents are dynamically assigned to different individual ones (or groups) of locations in the main store 113. In other embodiments, individual ones of the LBAs or LBA extents may be statically associated with individual ones (or groups) of locations in the main store 113. For various reasons, some of which are described further below, performance of device 108 may be optimized by first temporarily storing received write commands in locations within cache memories 114 and/or 115, for example, and at a later time, transferring the data into locations in the main store 113. It should be noted that it is not necessary that all data that is received in device 108 be ultimately transferred to main store 113.

In some embodiments, first level cache 114 in storage entity 112 may be configured as a circular buffer in which data for host write commands fill substantially in arrival order as LBA extents for one command, multiple sequential commands, or multiple overlapping commands. In one embodiment, the first level cache 114 comprises a solid state memory having a plurality of erasure blocks configured as a circular buffer with a plurality of memory slots that are re-used in a predetermined order. Each memory slot of the plurality of memory slots utilizes a different portion of the plurality of erasure blocks. In such an embodiment, the controller 110 is configured to move any of the received data extents contained in an earliest-filled slot of the plurality of memory slots to the second cache memory 115 or the main store 113 before the solid state memory is re-used for data storage.

In some embodiments, data for multiple received commands are LBA sorted by the processor controller 110 before filling the first level cache 114 in storage entity 112. When a number of LBA extents stored in first level cache 114 reach a predetermined threshold, for example, they are transferred to second level cache 115. When a number of LBA extents stored in second level cache 115 reach a threshold, for example, they are transferred from second level cache to main store 113. In some embodiments, as the received LBA extents are transferred to second level cache 115, controller 110 sorts or groups the LBA extents read from first level cache 114 into different smaller groups or subsets based on ranges of LBAs, and then writes the LBA extents to second level cache 115 in different LBA-ordered smaller groups.

Figure 1B:
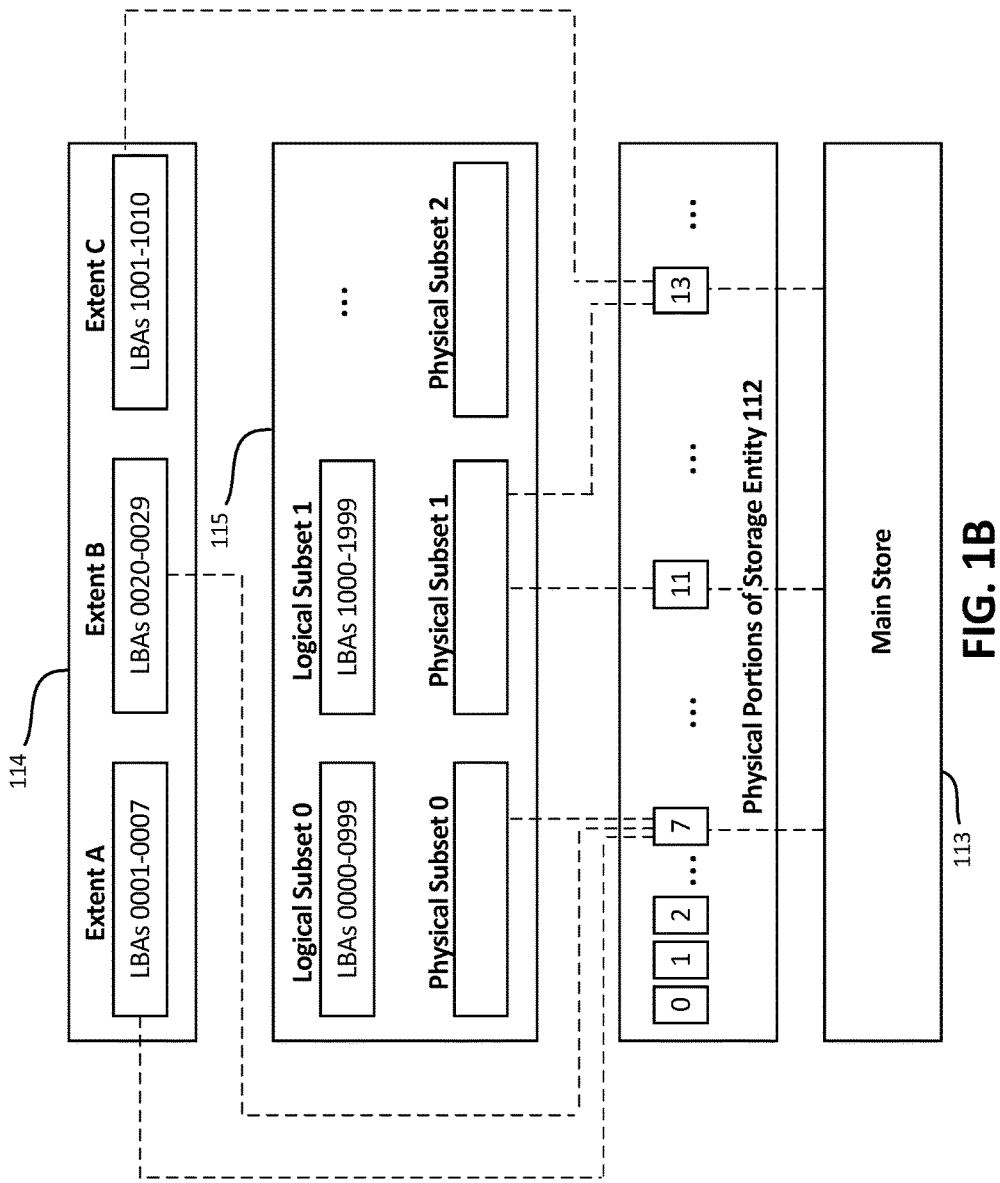
FIG. 1B is a simplified block diagram that includes examples of data transfer operations that may be carried out in the system of FIG. 1A.

In one embodiment, data transfers from first level cache 114 to second level cache 115 are carried out by sorting the LBA extents stored in first level cache 114 in monotonically increasing LBA order, discarding repeated LBAs such that only the most recently received data for a given LBA is retained, and then writing to the second level cache 115 in LBA order. For example, as shown in FIG. 1B, at a particular point in time, first level cache 114 may include three LBA extents A, B and C. LBA extent A may include LBAs 0001-0007, LBA extent B may include LBAs 0020-0029, and LBA extent C may include LBAs 1001-1010. Here, the three LBA extents are written to second level cache 115 in LBA order. In a particular embodiment, second level cache 115 is associated with a suitable number of logical and physical subsets. Each logical subset may be configured to include only a particular range of contiguous LBAs. Each physical subset may also be configured to use a different portion of the storage entity 112. Each logical subset may be configured to use a different set of the physical subsets. For example, as shown in FIG. 1B, logical subset 0 may be configured to include LBAs 0-999, logical subset 1 may be configured to include LBAs 1000-1999, etc.; at one moment physical subset 0 may be configured to use portion 7 of storage entity 112, physical subset 1 to use portion 11 and 13 of storage entity 112, physical subset 2 not to use any portion. In such an embodiment, LBA extent A (LBAs 0001-0007) and B (LBAs 0020-0029) may be associated with physical subset 0 of second level cache 115. LBA extent C (LBAs 1001-1010) may be associated with physical subset 1 of second level cache 115. At suitable times (for example, when the read channel of 114 and the write channel of 115 are available) a selected logical subset of LBA extents may be transferred from first level cache 114 to second level cache 115. For example, as shown in FIG. 1B, at one suitable time LBA extents A and B may be transferred to portion 7, and at another suitable time LBA extent C may be transferred to portion 13. At a suitable times (for example, when the read channel of 115 and the write channel of 113 are available), different portions of different subsets of second level cache 115 may be transferred to main store 113. Specific details regarding such LBA-based grouping and associated data transfer operations are provided below in connection with FIGS. 2A and 2B.

Figure 2A:
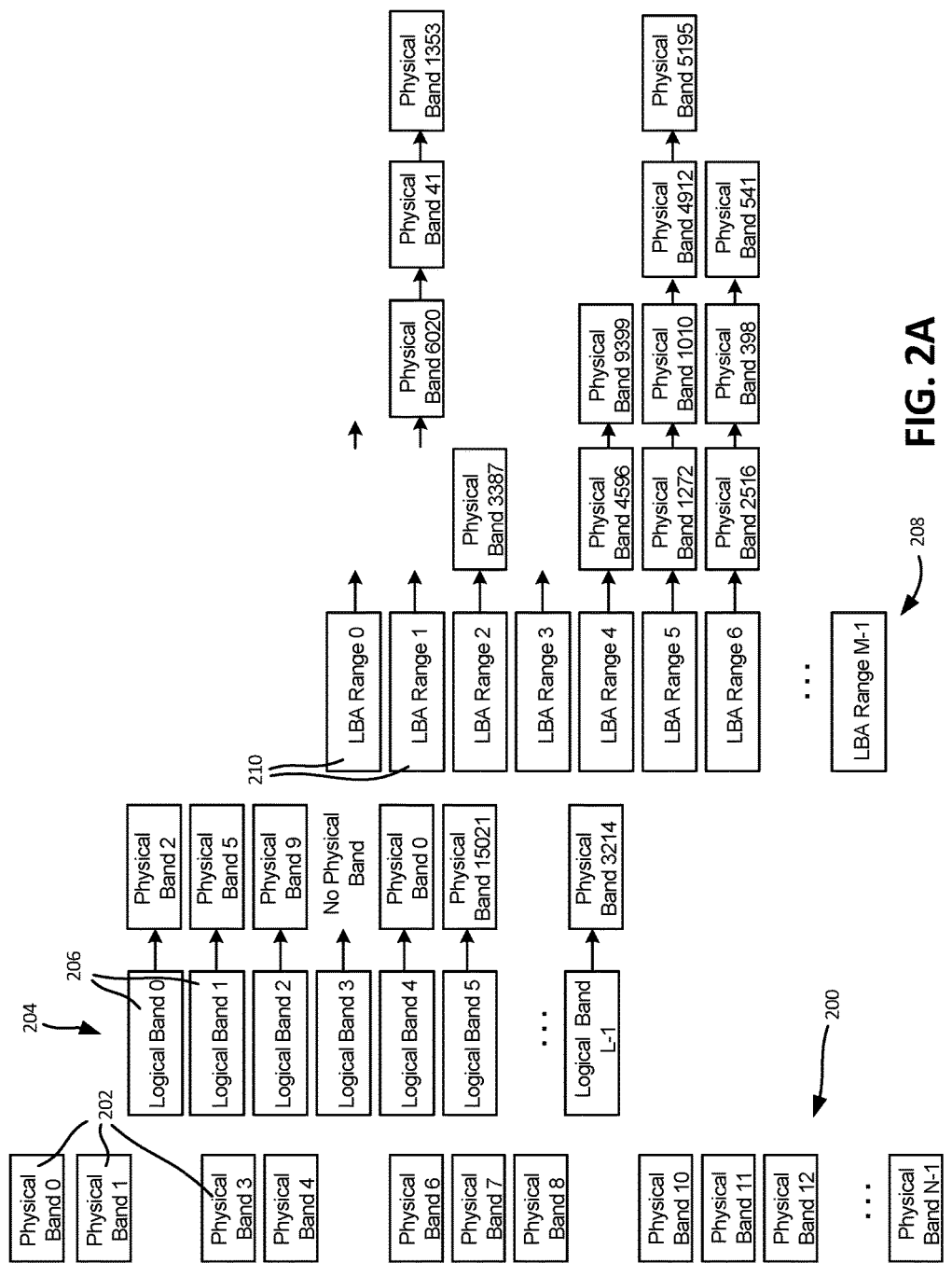
FIGS. 2A and 2B are simplified block diagrams that show a multi-level caching system that employs LBA ranges to carry out data storage operations.
Figure 2B:
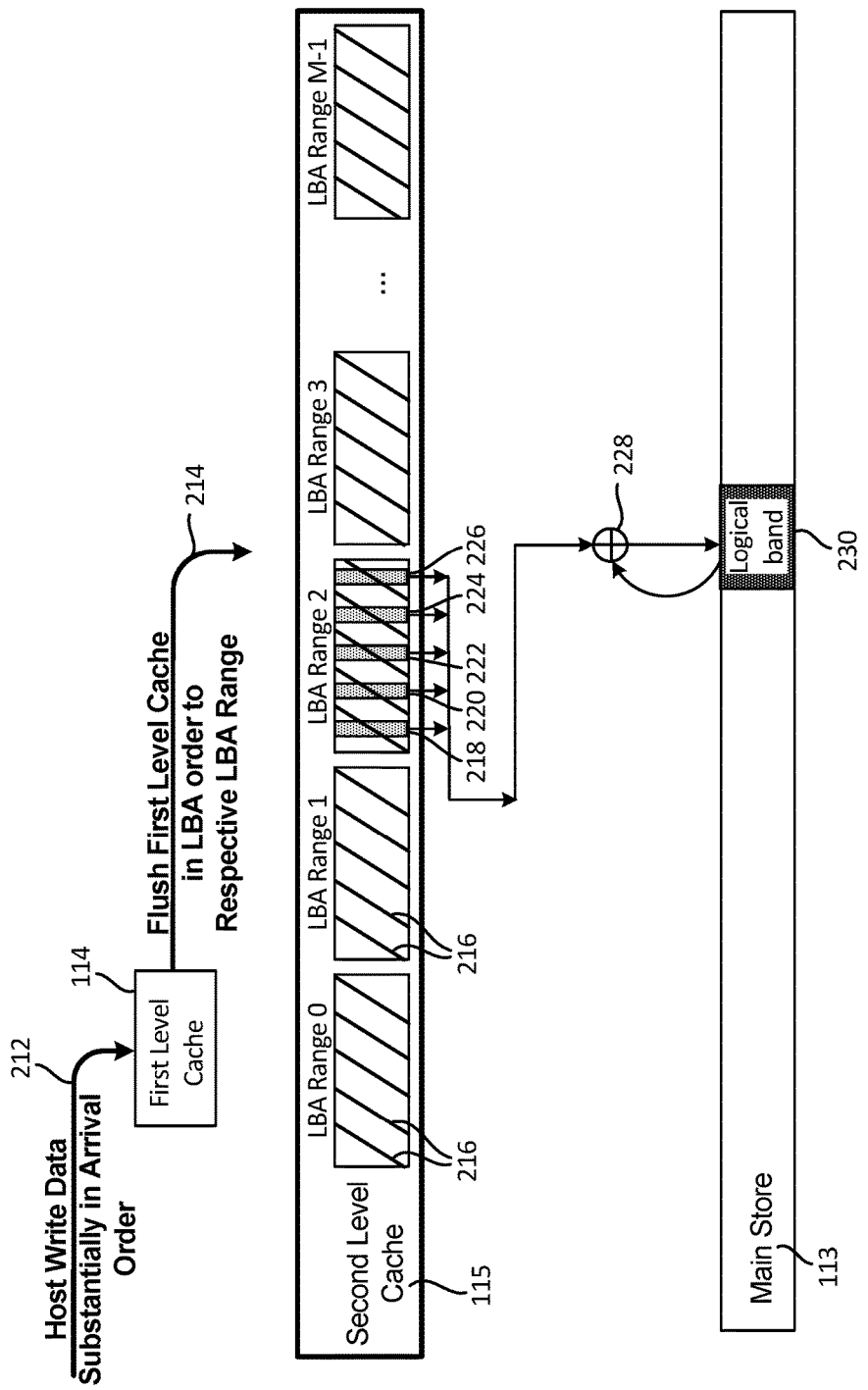

FIGS. 2A and 2B are simplified block diagrams showing physical bands, logical bands and groups of physical bands that are utilized to carry out data storage operations in a memory device such as 108 in accordance with one embodiment. The entire set of N physical bands that constitutes the storage space supplied by storage entity 112 (shown in FIG. 1A) is denoted by reference numeral 200. As noted above, storage entity 112 may include a plurality of memories of various sizes and types. Thus, the set of physical bands N may include physical bands from memories of various sizes and types. In certain embodiments, which are described further below, physical bands of the set of N physical bands may include tracks of a disc and/or physical erasure blocks or stripes of a Flash memory. Individual physical bands 0 through N-1, which together make up set 200, are each denoted by reference numeral 202. In one embodiment, all individual physical bands 202 are of a same size (i.e., supply a same data capacity), thereby allowing for arbitrary assignment. In other embodiments, individual physical bands 202 that constitute set 200 may be of different sizes. Physical main store 113 (shown in FIG. 1A) is associated with a logical space that comprises a complete set of L logical bands that is denoted by reference numeral 204. Individual logical bands 0 through L-1, which together constitute set 204, are each denoted by reference numeral 206.

As indicated above, physical memory in 112 may be organized for three uses, namely first level cache 114, second level cache 115 and main store 113. Thus, although main store 113 may occupy a particular region of storage entity 112 that is separate from regions of storage entity 112 allocated to first level cache 114 and second level cache 115, in different embodiments, any available physical bands from a set of physical bands 200 may be dynamically assigned to logical bands 206. In one embodiment, only one physical band 202 may be assigned to any one logical band 206. The assignment of the physical band 202 to the logical band 206 may be carried out dynamically. In such embodiments with dynamic assignment, logical bands 206 whose LBAs have never been a part of any host write command received in memory device 108, or whose LBAs have been unmapped by a host unmap command may have no physical band assigned. In general, a "written" LBA can be converted into an "unwritten" logical block. This conversion may be carried out with the help of a suitable host command such as the host unmap command. It should be noted that in some embodiments, due to over-provisioning, N is substantially larger than L. In other embodiments, due to thin provisioning, N is substantially smaller than L. In some embodiments, logical-physical band assignments may be static. In such embodiments, an additional scratchpad memory (not shown) may be employed to facilitate data updates of physical bands 202 in their respective fixed/static logical assignment. In certain embodiments, multiple physical bands 202 may be assigned to a single logical band 206. In some embodiments, the assignment of multiple physical bands 202 to a single logical band 206 accommodates logical bands with larger data size than one of the physical bands. In other embodiments, the assignment of multiple physical bands 202 to a single logical band 206 is temporary during an update of part of the LBA extent of the logical band such as early in a sequential write to a logical band 206.

In one embodiment, second level cache 115 (shown in FIG. 1A) is associated with a logical space that comprises a complete set of M LBA ranges that is denoted by reference numeral 208 in FIG. 2A. Individual LBA ranges 0 through M-1, which together constitute set 208, are each denoted by reference numeral 210. In one embodiment, any suitable number of physical bands 202 may be assigned to any one LBA range 210. The assignment of the physical band(s) 202 to the LBA range 210 may be carried out dynamically in different embodiments. In such embodiments, each LBA range 210 is associated with zero or more physical bands, and the number of physical bands assigned to a LBA range 210 may grow on demand. As in the case of the set of L logical bands 204, the set of M LBA ranges 208 covers the whole LBA space used by the host. Each LBA range 210 is a slice of contiguous LBAs, which comprise a fraction of the whole LBA space. In one embodiment, the whole LBA space is equally divided amongst the LBA ranges 210. In some embodiments, different ones of LBA ranges 210 may be associated with different numbers of LBAs. A LBA range 210 is selected for writing based on a comparison of LBAs associated with data to be written into second level cache 115 and the range of LBAs associated with the LBA range 210. In different embodiments, the number of logical bands (L) is substantially greater than the number of LBA ranges (M). In general, any suitable number of LBA ranges may be employed. In one embodiment, the number of LBA ranges is a function of the overprovisioning or extra storage capacity (for example, the number of extra physical bands 200). In one embodiment, the number of LBA ranges (M) is approximately equal to half the number of extra physical bands (N-L) such that each LBA range can have one full and one filling physical band. In another embodiment, the number of LBA ranges (M) is approximately equal to the square root of the number of extra physical bands (N-L). This relationship is shown in Equation 1 below.

$$M \cong \sqrt{N-L} \qquad \text{Equation 1}$$

As noted above, data is stored in first level cache 114 substantially in an order that it is received in memory device 108 (shown in FIG. 1A). Data from first level cache 114 is then transferred to second level cache 115. Filling of second level cache 115 is segregated by LBA range and is sorted in substantially monotonically increasing LBA order. A LBA range 210 may be filled by appending data at the end of a last/most-recently allocated physical band 202 associated with that LBA range 210 if the last/most-recently allocated band 202 is not full. If the last/most-recently allocated physical band 202 is full and data has to be written to the LBA range 210, a new physical band 202 is dynamically allocated to the LBA range 210, and the data is written into the newly-allocated band 202. In general, in different embodiments, physical bands 202 are assigned to a LBA range 210 on an as-needed basis (for example, when all previously-assigned physical bands associated with that LBA range 210 are full).

A decision to select a particular LBA range 210 for cleaning to one or more logical bands associated with the particular LBA range 210 may be made based on one or more different criteria. The criteria may include the elapsing of a predetermined time period of allocation of a physical band to the particular LBA range (to clean "old" bands); a physical band in the particular LBA range having a substantially small amount of valid data; exceeding a threshold level of resources assigned to the particular LBA range (i.e., a large number of physical bands having been assigned to a particular LBA range), etc. In general, any suitable cleaning criteria may be used based on the application(s) for which a storage device (such as memory device 108 of FIG. 1A) may be used. A cleaned physical band may be added to a pool of available physical bands of storage entity 112. A particular example of data storage using LBA ranges is described below in connection with FIG. 2B.

FIG. 2B is a simplified block diagram showing a first level cache (memory 114), a second level cache (memory 115) and main store 113. In second level cache 115, only individual LBA ranges 0, 1, 2, 3 and M-1 of the logical space are separately shown in FIG. 2B. In the interest of simplification, the physical bands associated with LBA ranges 0, 1, 2, 3 and M-1 are not shown. In FIG. 2B, arrow 212 indicates that host write data fill first level cache 114 substantially in an order of arrival of the write commands in the memory device 108. Arrow 214 indicates that data from first level cache 114 is transferred in LBA order to second level cache 115. Each diagonal line 216 in LBA ranges 0, 1, 2, 3 and M-1 represents data in monotonically increasing LBA order from first level cache 114 into memory associated with the respective LBA range. FIG. 2B also shows data portions 218, 220, 222, 224 and 226 within LBA range 2 being transferred to main store 113. The data portions 218, 220, 222, 224 and 226 are associated with LBAs within a single logical band of main store 113. As can be seen in FIG. 2B, data portions 218, 220, 222, 224 and 226 are transferred to the logical band 230. Any complementary valid data from the logical band 230 is retained in the write to the logical band 230. Summing node 228 indicates that the new data portions 218, 220, 222, 224 and 226 are merged with the complementary data from logical band 230. In the example shown in FIG. 2B, data portions 218, 220, 222, 224 and 226 are from five separate data transfers from second level cache 114 to logical band 230. Since second level cache 115 is iteratively filled, it is possible for data from two or more of portions 218, 220, 222, 224 and 226 to at least partially overlap. If an overlap is detected, the most recent copy of the overlapping data may be transferred to logical band 230.

Figure 3:
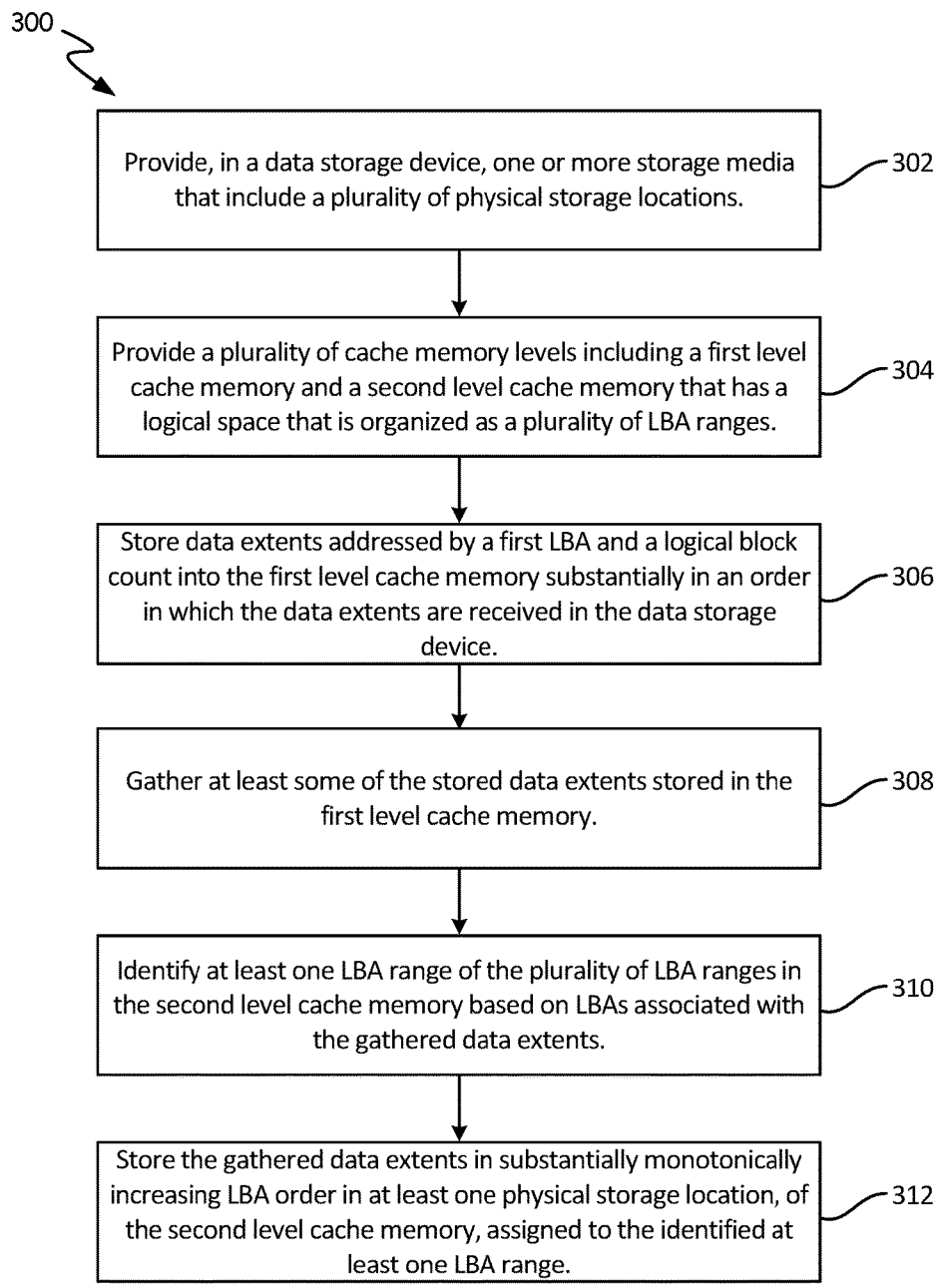
FIG. 3 is a flow diagram of a data storage method in accordance with one embodiment.

FIG. 3 is a flow diagram 300 of a data storage method in accordance with one embodiment. The method includes, at step 302, providing, in a data storage device, one or more storage media that include a plurality of physical storage locations. At step 304, a plurality of cache memory levels are provided. The levels include a first cache memory level and a second cache memory level that has a logical space that is organized as a plurality of LBA ranges. In one embodiment, the LBA ranges are abutting with no gaps and no overlap in LBAs of different ranges. At step 306, data extents addressed by a first LBA and a logical block count are stored into the first level cache memory substantially in an order in which the data extents are received in the data storage device. The method further includes, at step 308, gathering at least some of the data extents stored in the first level cache memory. At step 310, at least one LBA range of the plurality of LBA ranges is identified in the second level cache memory based on LBAs associated with the gathered data extents. At step 312, the gathered data extents are stored in substantially monotonically increasing LBA order in at least one physical storage location, of the second level cache memory, assigned to the identified at least one LBA range.

Figure 4:
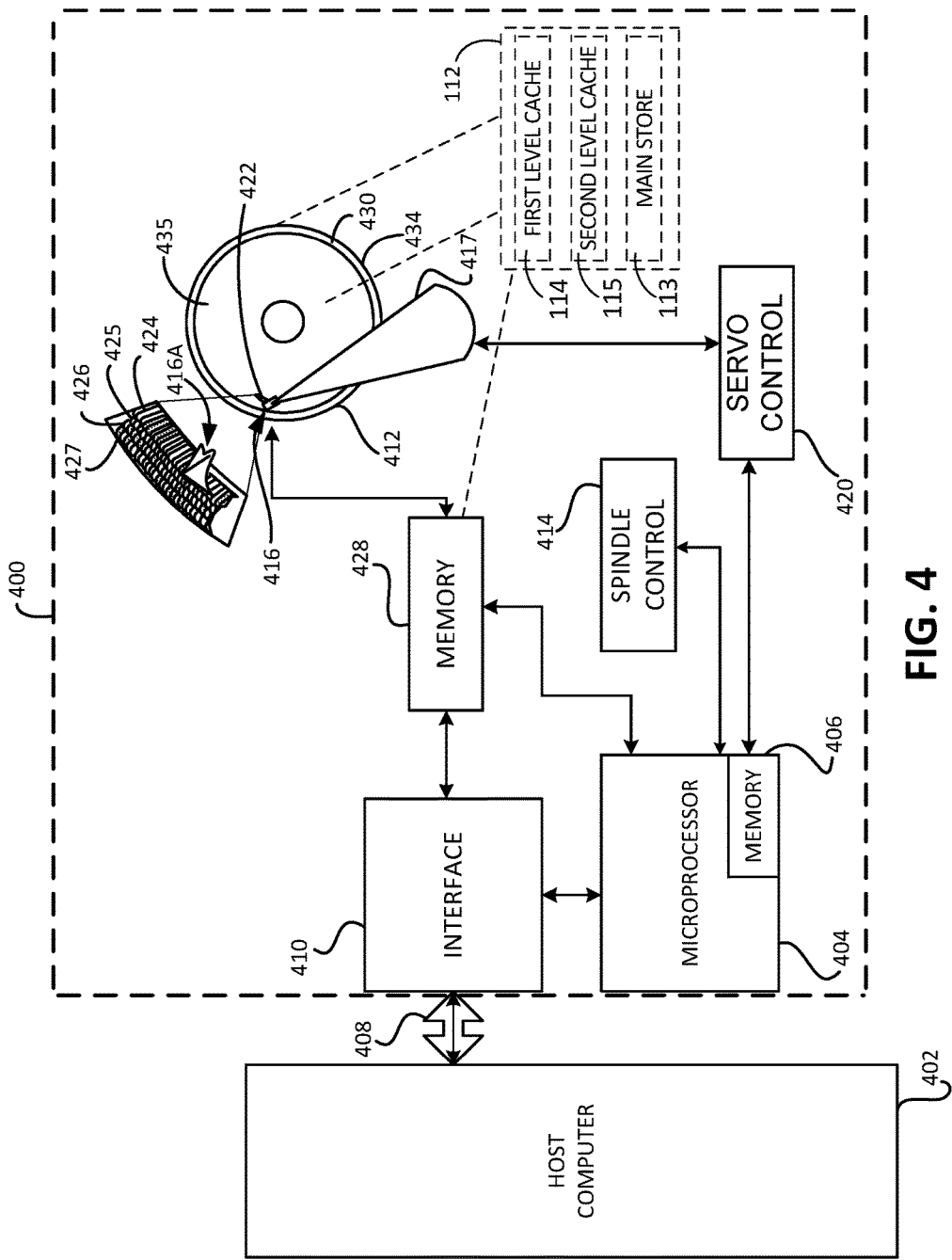
FIG. 4 is a block diagram of a data storage device in accordance with one embodiment.

FIG. 4 shows a block diagram of the disc drive 400 in accordance with one embodiment. Disc drive 400 is a particular example of a data storage or memory device 108. As will be described in detail further below, in one embodiment disc drive 400 employs one or more discs on which multiple data tracks may be written in a partially-overlapping shingled pattern, with each successive track overwriting a portion of the previous track. In another embodiment, disc drive 400 employs one or more discs on which no data tracks are written in a partially-overlapping shingled pattern.

Disc drive 400 is shown in FIG. 4 to be operably connected to a host computer 402 in which disc drive 400 may be mounted. Disc drive 400 includes a microprocessor 404 that generally provides top level communication and control for disc drive 400 in conjunction with programming for microprocessor 404 stored in microprocessor memory 406. Disc drive 400 may communicate with host computer 402 using a bus 408.

Memory 406 can include random access memory (RAM), read only memory (ROM), and other sources of resident memory for microprocessor 404. Disc drive 400 includes one or more data storage discs 412. Discs 412 are rotated at a substantially constant high speed by a spindle control circuit 414. One or more heads 416 communicate with the surface(s) of discs 412 to carry out data read/write operations. The radial position of heads 416 is controlled through the application of current to a coil in an actuator assembly 417. A servo control system 420 provides such control.

As noted above, in some embodiments, tracks may be written on one or more storage discs 412 in a partially-overlaying relationship. The overlaying of tracks is shown in close-up view of area 422 of disc(s) 412. In area 422, a corner of head 416A is shown writing a track portion 424. Different shading within the track portion 424 represents different magnetic orientations that correspond to different values of stored binary data. The track portion 424 is overlaid over part of track portion 425. Similarly, track portion 425 is overlaid over part of portion 426, portion 426 is overlaid over portion 427, etc.

The portions 424-427 may be part of what is referred to herein as a physical band which, in this embodiment, may include tens, hundreds or thousands of similarly overlapping, concentric portions 424-427. Gaps are created between such physical bands so that each physical band can be updated independently of other physical bands. The overlaying of successive track portions within a physical band in shingled magnetic recording (SMR) means that individual parts of the physical band may not be randomly updated on their own. This is because spacings between centers of track portions 424, 425, 426, 427, for example, are smaller than a width of a write pole (not separately shown) of head 416. However, a width of a reader (not separately shown) of head 416 may be small enough to read individual track portions 424, 425, 426, 427, thereby enabling random reads of data to be carried out. As described above in connection with FIGS. 1 and 2A-2C, a multi-level caching system with at least one cache level employing LBA ranges helps manage the need to write to a band in physically sequential order.

In certain embodiments, disc drive 400 includes a memory 428 that may serve as, for example, a first/upper level cache. In some embodiments, memory 428 is physically separate from discs 412. The memory 428 may be of a different type than the discs 412. For example, in certain embodiments, memory 428 may be constructed from solid-state components. In one embodiment, memory 428 may be a Flash memory. In such an embodiment, the Flash memory may include a plurality of programmable devices that are capable of storing data. A plurality of physical erasure blocks are within each of the devices, and each physical erasure block has physical pages of transistors. The Flash memory may be logically organized as a plurality of stripes where each stripe may include one or more physical erasure blocks or physical pages from multiple devices. The physical erasure blocks and/or stripes may be managed as physical bands and therefore may be a part of what are referred herein as physical bands.

In some embodiments, the one or more storage discs 412 are managed as non-overlapping disc portion 430 and disc portion 435. In some embodiments, disc portion 430 is used for a second level cache (i.e., a portion of the disc(s) 412 may be reserved for use as second level cache). In other embodiments, locations for the second level cache may be dynamically allocated from a pool of available locations on disc(s) 412. Thus, although disc portion 430 is shown in FIG. 4 as being located proximate to an outer diameter 434 of disc(s) 412, in some embodiments, the second level cache may include a variable number of disc storage locations that can be selected from any suitable area(s) of the disc(s) 412. In some embodiments, disc portion 430 may comprise shingled bands. In other embodiments, disc portion 430 may be non-shingled (i.e., element 430 may include tracks that are each of a sufficiently large width relative to the width of the write pole of head 416 to allow the write pole to write data to individual ones of the tracks without overwriting data in any adjacent tracks).

Disc drive 400 may use memory 428 in conjunction with disc portion 430 in order to manage data as the data is being transferred to main storage locations 435 on disc(s) 412. In the interest of simplification, components such as a read/write channel which encodes data and provides requisite write current signals to heads 416 is not shown in FIG. 4. Also, any additional buffers that may be employed to assist in data transfer to the memory 428 and the main storage locations 435 are not shown in the interest of simplification.

The physical bands of drive 400 may be utilized in a manner described above in connection with FIGS. 1A, 1B, 2A and 2B because storage entity 112 (of FIG. 1A), which may include a plurality of memories of various sizes and types, is similarly organized as physical bands for use as multi-level cache and main store. The description included below links elements of FIG. 4 with elements/features of FIGS. 1A, 1B, 2A and 2B. Accordingly, in the description below, elements 200, 206, etc., of FIGS. 2A and 2B are used in connection with logical/physical bands of device 400 of FIG. 4. Also, reference numerals 113, 114 and 115 used in FIG. 1A are repeated in FIG. 4 due to the similar use of the storage elements in FIGS. 1A and 4.

Dashed lines within dashed box 112 of FIG. 4 indicate that the entire set of physical bands that constitutes the storage space supplied by disc(s) 412 and memory 428 in disc drive 400 may be organized for three uses, namely a first level cache 114, a second level cache 115 and main store 113 in a manner similar to device 108 of FIG. 1A. Thus, although main storage area 435 shown in FIG. 4 may occupy a particular region of disc 412 that is separate from a region of disc 412 that is allocated to second level cache 430, in different embodiments, any available physical bands from a set of physical bands 200 may be dynamically assigned to logical bands 206 of device 400.

As indicated earlier, although second level cache 115 is shown in FIG. 4 as occupying a particular region of disc 412 that is separate from a region of disc 412 that is occupied by main storage area 435, in different embodiments, any available physical bands from set 400 may be dynamically assigned to LBA ranges 210. In general, the multi-level caching method used in disc drive 400 is similar to that described in connection with FIGS. 1A, 1B, 2A and 2B and therefore the description provided above in connection with FIGS. 1A, 1B, 2A and 2B applies to physical and logical bands of FIG. 4.

Figure 5:
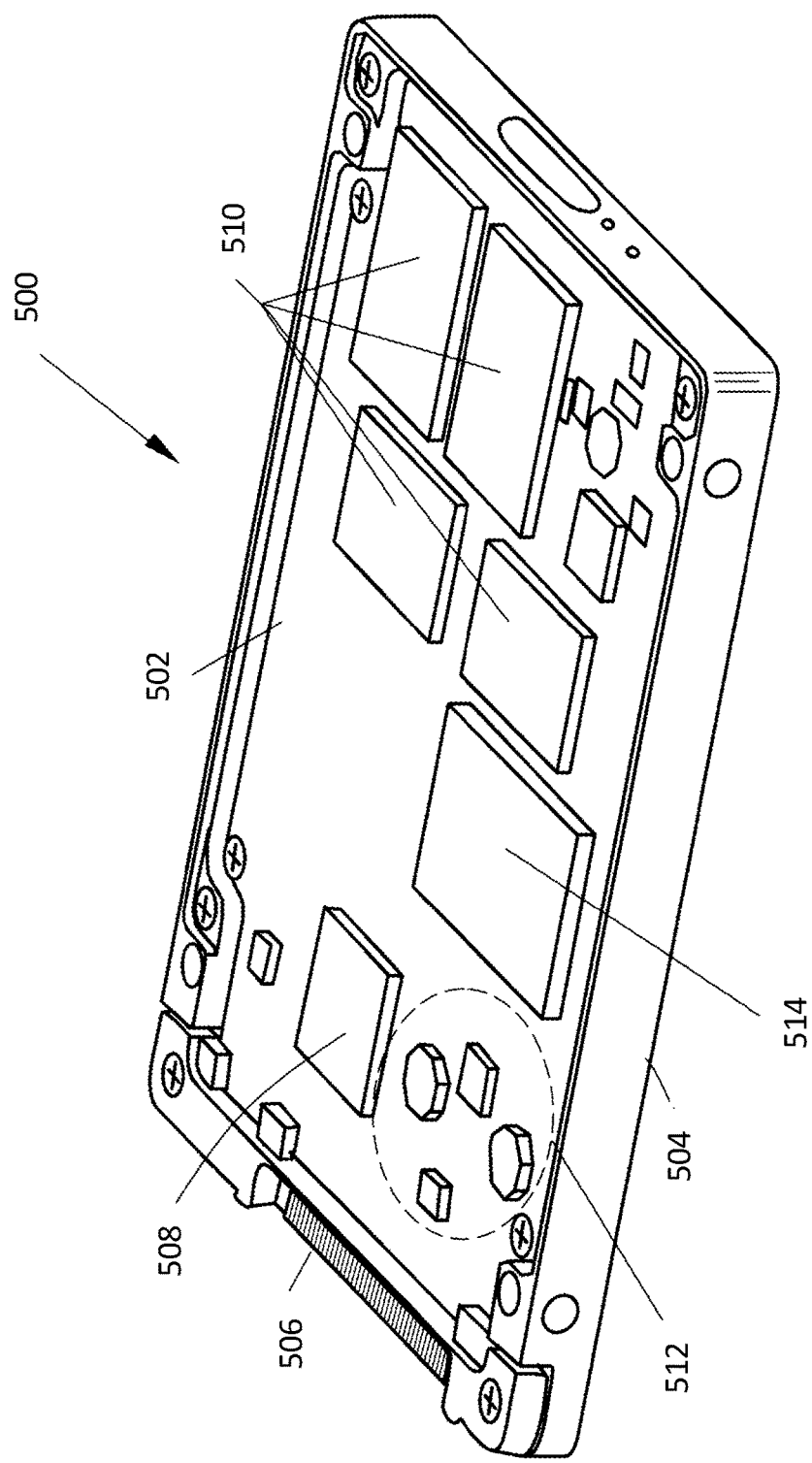
FIG. 5 is an isometric view of a solid-state drive that employs a multi-level caching system in accordance with one embodiment.

FIG. 5 illustrates an oblique view of a solid state drive (SSD) 500 in which the presently disclosed method described above in connection with FIGS. 1A-4 is useful. SSD 500 includes one or more circuit card assemblies 502 and typically includes a protective, supportive housing 504, a top cover (not shown), and one or more interface connectors 506. SSD 500 further includes a controller ASIC 508, one or more non-volatile memory devices 510, and power regulation circuitry 512. The memory devices 510 are essentially the SSD's data storage media for the caches and main store. In some applications, SSD 500 further includes a power-backup energy storage device, such as a super-capacitor 514.

In accordance with certain aspects, the solid-state drive 500 includes a circuit card assembly 502 that includes a connector 506 for connection to a host computer. In accordance with certain aspects, the connector 506 includes a NVMe, SAS, FC-AL, SCSI, PCI-E, IDE, AT, ATA, SATA, IEEE-1394, USB or other interface connector adapted for connection to a host.

If, as shown in FIG. 5, more than one non-volatile memory device 510 is included in SSD 500, then one of the non-volatile memory devices 510 may be used as the first level cache 114 and configured as a circular buffer. Physical storage locations (for example, erasure blocks) in the other one or more non-volatile memory devices 510 may be utilized as second level cache 115 and as main storage locations 113. In other embodiments, physical storage locations in the one or more non-volatile memory devices 510 may serve a pool of physical bands for assignment to first level cache, second level cache and main storage.

SSD 500 does not include bands of tracks on a disc of the type described in connection with FIG. 4. However, SSD 500 may include erasure blocks as the physical storage locations. As noted above, erasure blocks are a part of what are considered physical bands in this disclosure. Thus, the multi-level caching methods described in connection with FIGS. 1A through 4 may be used in SSD 500. To avoid repetition, a detailed description of the multi-level caching methods described in connection with FIGS. 1A through 4 applied in SSD 500 is not provided.

In accordance with various embodiments, the methods described herein may be implemented as one or more software programs running on one or more computer processors or controllers, such as those included in devices 108, 400 and 500. Dedicated hardware implementations including, but not limited to, application specific integrated circuits, programmable logic arrays and other hardware devices can likewise be constructed to implement the methods described herein.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   one or more storage media that comprise a plurality of physical storage locations;
   a main storage logical space comprising a plurality of logical elements;
   at least one cache memory having a logical space that includes a plurality of separately managed non-overlapping logical block address (LBA) ranges; and
   a controller configured to:
      receive data extents addressed by a first LBA and a logical block count;
      identify at least one separately managed LBA range of the plurality of separately managed non-overlapping LBA ranges in the at least one cache memory based on LBAs associated with at least some of the received data extents;
      dynamically assign at least one physical storage location to the identified LBA range from a pool of available physical storage locations of the plurality of physical storage locations upon detecting a need for the at least one physical storage location;
      store the at least some of the received data extents in substantially monotonically increasing LBA order in at least one physical storage location, of the at least one cache memory, assigned to the identified at least one LBA range of the separately managed non-overlapping LBA ranges; and
      dynamically assign different ones of the plurality of physical storage locations of the one or more storage media to different ones of the plurality of logical elements;
   wherein the plurality of physical storage locations comprises a set of N physical bands that constitutes an entire storage space supplied by the data storage device, and wherein the plurality of logical elements comprises a set of L logical bands that constitutes a complete logical space employed by the data storage device, and wherein a total number of LBA ranges in the plurality of separately managed non-overlapping LBA ranges is less than N-L.

2. The data storage device of claim 1 and wherein the at least one cache memory comprises a plurality of cache memories comprising:
   a first level cache memory; and
   a second level cache memory having the logical space that includes the plurality of separately managed LBA ranges, and
   wherein the controller is further configured to:
      store the data extents addressed by the first LBA and the logical block count into the first level cache memory substantially in an order in which the data extents are received in the data storage device;
      gather the at least some of the data extents stored in the first level cache memory;
      identify the at least one LBA range of the plurality of LBA ranges in the second level cache memory based on the LBAs associated with the gathered data extents; and
      store the gathered data extents in the substantially monotonically increasing LBA order in the at least one physical storage location, of the second level cache memory, assigned to the identified at least one LBA range.

3. The data storage device of claim 2 and wherein the controller is further configured to transfer at least some of the data extents in the at least one physical storage location assigned to the identified at least one LBA range to at least one of the plurality of physical storage locations, on the one or more storage media, assigned to a main storage physical space.

4. The data storage device of claim 3 and wherein the first level cache memory comprises a solid state memory having a plurality of erasure blocks configured as a circular buffer with a plurality of memory slots that are re-used in a predetermined order, and wherein each memory slot of the plurality of memory slots utilizes a different portion of the plurality of erasure blocks, and wherein the controller is configured to move any of the received data extents contained in an earliest-filled slot of the plurality of memory slots to the second cache memory or the main storage physical space before the solid state memory is re-used for data storage.

5. The data storage medium of claim 2 and wherein the one or more storage media comprise a homogeneous memory portion, and wherein the homogenous memory portion comprises a first area that serves as the second level cache memory and a second area that serves as a main storage physical space.

6. The data storage device of claim 1 and wherein the controller is further configured to:
   dynamically assign one or more different ones of the plurality of physical storage locations of the one or more storage media to different ones of the plurality of LBA ranges.

7. A method comprising:
   transferring first data extents from a first memory area to a second memory area based on logical block addresses (LBAs) associated with the first data extents being within an LBA range of a plurality of non-overlapping separately managed LBA ranges; and
   wherein the first data extents are stored in substantially monotonically increasing LBA order in at least one physical storage location, of the second memory area, assigned to the LBA range of the plurality of non-overlapping LBA ranges, and
   wherein the at least one physical storage location is dynamically assigned to the LBA range from a pool of available physical storage locations of the second memory area upon detecting a need for the at least one physical storage location;

wherein the at least one physical storage location comprises a set of N physical bands that constitutes an entire storage space supplied by a data storage device, and wherein the plurality of logical elements comprises a set of L logical bands that constitutes a complete logical space employed by the data storage device, and wherein a total number of LBA ranges in the plurality of separately managed non-overlapping LBA ranges is less than N-L.

8. The method of claim 7 and wherein the first memory area serves as a first level cache memory, and wherein the second memory area serves as a second level cache memory.

9. The method of claim 7 and wherein both the first memory area and the second memory area are included in a memory that serves as a single level of cache memory.

10. The method of claim 7 and further comprising transferring second data extents from the second memory area along with the first data extents from the first memory area to the LBA range of the plurality of LBA ranges.

11. The method of claim 7 and further comprising transferring at least some of the data extents in the at least one physical storage location assigned to the LBA range of the plurality of LBA ranges to at least one of a plurality of physical storage locations in a third memory area that serves as a main storage physical space.

12. A data storage device comprising:
a plurality of physical storage locations;
a first logical space that includes a plurality of separately managed non-overlapping logical block address (LBA) ranges; and
a controller configured to:
receive data extents addressed by a first LBA and a logical block count;
identify at least one separately managed LBA range of the plurality of separately managed non-overlapping LBA ranges based on LBAs associated with at least some of the received data extents;
dynamically assign at least one physical storage location to the identified LBA range from a pool of available physical storage locations of the plurality of physical storage locations upon detecting a need for the at least one physical storage location; and
store the at least some of the received data extents in substantially monotonically increasing LBA order in at least one physical storage location assigned to the identified at least one LBA range of the separately managed non-overlapping LBA ranges;

wherein the plurality of physical storage locations comprises a set of N physical bands that constitutes an entire storage space supplied by the data storage device, and wherein the plurality of logical elements comprises a set of L logical bands that constitutes a complete logical space employed by the data storage device, and wherein a total number of LBA ranges in the plurality of separately managed non-overlapping LBA ranges is less than N-L.

13. The data storage device of claim 12 and wherein the at least one physical storage location assigned to the identified at least one LBA range is assigned to a cache memory space.

14. The data storage device of claim 13 and wherein the controller is further configured to transfer at least some of the data extents from the at least one of physical storage location assigned to the identified at least one LBA range to at least one of the plurality of physical storage locations assigned to a main storage physical space.

15. The data storage device of claim 12 and wherein at least some physical storage locations of the plurality of physical storage locations are shingled magnetic recording bands.

16. The data storage device of claim 15 and wherein the shingled magnetic recording bands are assigned to a main storage space.

17. The data storage device of claim 15 and wherein the solid state memory locations are assigned to a cache memory space.

18. The data storage device of claim 12 and wherein at least some physical storage locations of the plurality of physical storage locations are solid state memory locations.

19. The data storage device of claim 12 and wherein the first logical space is a cache memory logical space, and wherein the data storage device further comprises a second logical space that is a main storage logical space comprising a plurality of logical elements, and wherein the controller is further configured to:
dynamically assign different ones of the plurality of physical storage locations to different ones of the plurality of logical elements.

* * * * *